United States Patent [19]

Toole et al.

[11] 4,315,479

[45] Feb. 16, 1982

[54] SILICON WAFER STEAM OXIDIZING APPARATUS

[75] Inventors: Monte M. Toole, Mill Valley; Robert B. Champagne, Mountain View, both of Calif.

[73] Assignee: Atomel Corporation, Mountain View, Calif.

[21] Appl. No.: 126,721

[22] Filed: Jun. 27, 1980

[51] Int. Cl.³ .......................................... H01L 21/316
[52] U.S. Cl. .................................... 118/726; 118/715; 118/719; 118/724; 427/93; 427/255.4
[58] Field of Search ................ 427/93, 95, 255.4, 377; 118/719, 715, 724, 725, 726, 50, 900; 219/271, 273, 275

[56] References Cited

U.S. PATENT DOCUMENTS

| | | | |
|---|---|---|---|
| 3,446,659 | 5/1962 | Wisman et al. ........................ | 427/93 |
| 3,573,974 | 4/1971 | Castrucci et al. .............. | 427/45.1 X |
| 3,661,117 | 5/1972 | Cornelius et al. .............. | 219/275 X |
| 4,018,184 | 4/1977 | Nagasawa et al. ................... | 118/715 |
| 4,167,915 | 9/1979 | Toole et al. ..................... | 118/724 X |
| 4,275,094 | 6/1981 | Takagi et al. .......................... | 427/93 |

FOREIGN PATENT DOCUMENTS 133383  12/1978  Fed. Rep. of Germany ...... 118/719

OTHER PUBLICATIONS

"Oxidation of Silicon by High Pressure Steam" Ligenza, pp. 73-76, Journal of the Electro-Chemical Society, Feb. 1962.

"High Pressure Steam Apparatus, for the Accelerated Oxidation of Silcon" Panousis et al., Abst. #53, Spring Meeting of Electro-Chemical Soc., May 13-18, 1973.

"Low Temperature, High Pressure Steam Oxidation of Silicon, " Katz et al., Journal Electrochemical Soc.: Solid State Science & Tech., p. 1822, 10-1979

"Selective Oxidation of Silcon in Low Temperature High-Pressure Steam", Powell et al., IEEE Transactions on Electrical Devices, vol. ED-21 #10, Oct. 1974.

Primary Examiner—John D. Smith
Assistant Examiner—Bernard F. Plantz
Attorney, Agent, or Firm—Manfred M. Warren; Robert B. Chickering; Glen R. Grunewald

[57] ABSTRACT

A high-pressure, high-temperature gaseous chemical apparatus particularly designed for oxidation of silicon wafers and providing for pressure equalization across the wall of the vessel providing the reaction chamber, for a water boiling enclosure within the reaction chamber and the injection of liquid water under pressure into the enclosure and for the continuous flow through of water vapor at high temperature and high pressure in the reaction chamber while maintaining the aforementioned pressure balance.

3 Claims, 1 Drawing Figure

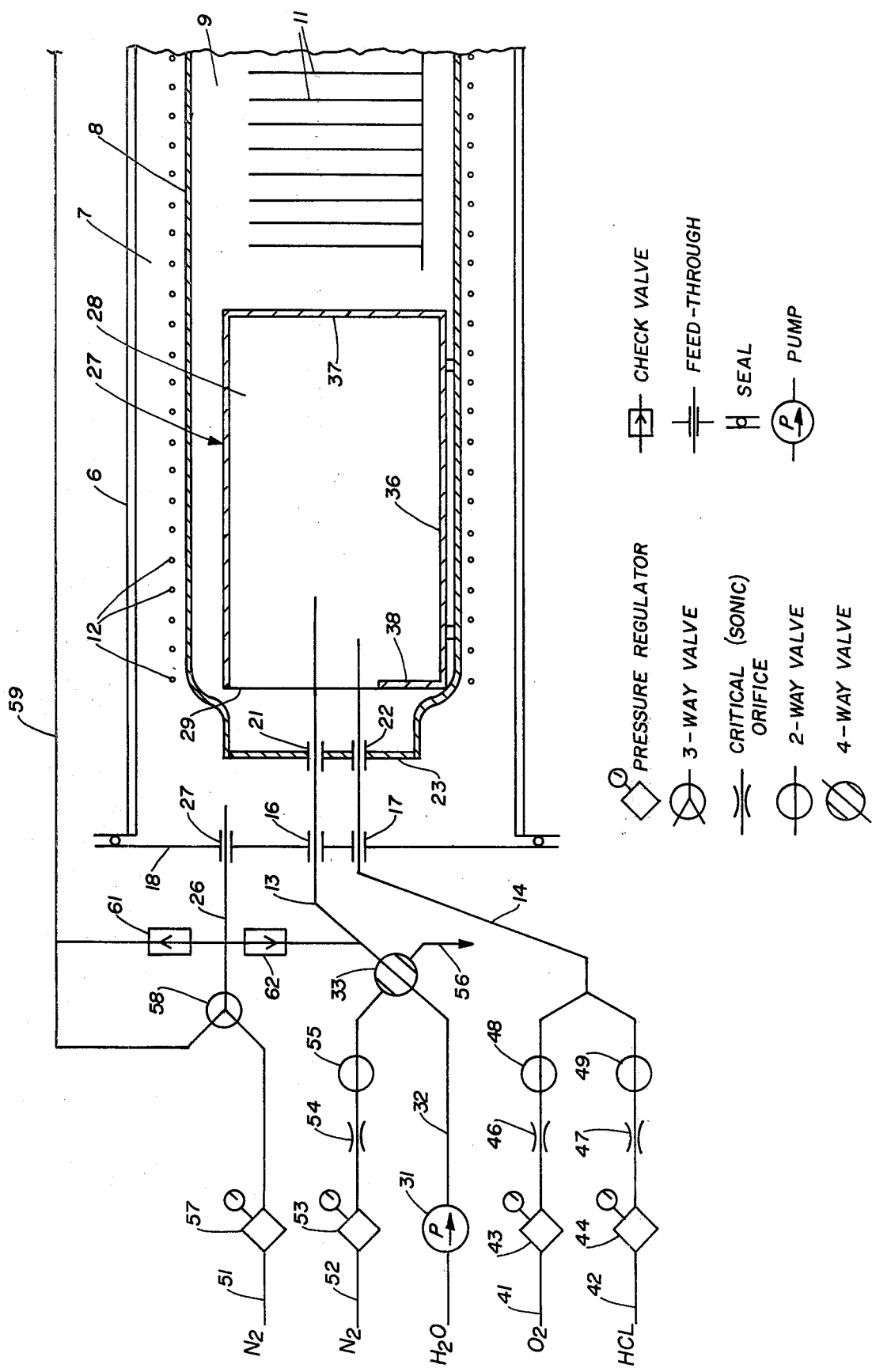

SILICON WAFER STEAM OXIDIZING APPARATUS

BACKGROUND AND SUMMARY OF THE INVENTION

It has been heretofore proposed to promote the growth of oxide coatings on silicon wafers by the use of high-pressure steam, see "Oxidation of Silicon by High-Pressure Steam," by Ligenza, Bell Telephone Laboratories, pages 73–76, Journal of the Electrochemical Society, February, 1962; "High Pressure Steam Apparatus for the Accelerated Oxidation of Silicon," by Panousis and Schneider, Bell Telephone Laboratories, Spring Meeting of the Electrochemical Society in Chicago, May 13–18, 1973; and "Selective Oxidation of Silicon in Low-Temperature High-Pressure Steam," authored by Powell, Ligenza and Schneider and published in IEEE Transactions on Electron Devices, Vol. ED-21, No. 10, October, 1974. High-pressure steam systems, while demonstrated in the laboratory, have not been available in commercial structures; nor has anyone succeeded in providing such high-pressure steam treatment on a continuous production basis wherein such high-pressure steam is introduced into and caused to flow continuously through a reaction chamber containing the wafers and wherein pressure equilization is maintained across the wall of the vessel providing the reaction chamber to permit the use of an otherwise fragile quartz vessel.

A successful continuous flow-through system is disclosed in U.S. Pat. No. 4,167,915 which provides for the introduction into and the continuous flow through the silicon wafer reaction chamber of hydrogen and oxygen gases functioning by pyrosynthesis to promote oxide growth.

As the principal feature of the present invention, a continuous flow-through system is provided utilizing high-pressure water vapor as the activating oxide-forming media.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

BRIEF DESCRIPTION OF FIGURE

The FIGURE is a fragmentary, longitudinal sectional view of a silicon wafer steam oxidizing apparatus constructed in accordance with the present invention.

DETAILED DESCRIPTION OF INVENTION

Much of the present apparatus and its components are similar to the apparatus disclosed in U.S. Pat. No. 4,167,915 to which reference is made for further detail. The structure comprises, briefly, a housing 6 providing a pressure chamber 7 and a vessel 8 mouted therein and providing a reaction chamber 9 dimensioned for receipt of semiconductor wafers 11. Vessel 8 is formed to provide access to chamber 9 for insertion and removal of wafers 11, see U.S. Pat. No. 4,167,915, this portion of the vessel being here deleted for clarity of illustration of other parts. Also in common with the apparatus of U.S. Pat. No. 4,167,915, the present apparatus has means 12 consisting of an electric heater element surrounding vessel 8 for heating reaction chamber 9; conduits 13 and 14 which are mounted through seals 16 and 17 in an end wall 18 of housing 6 and through seals 21 and 22 in an end wall 23 of vessel 8 for introducing chemically active gas under pressure into chamber 9; and conduit 26 mounted through a seal 27 in housing wall 18 for introducing an inert gas under pressure into chamber 7 external of vessel 8 for equalizing the pressure in chambers 7 and 9. Additionally, and as disclosed in U.S. Pat. No. 4,167,915, means is provided for discharging the active gas from chamber 9 in a continuous flow operation while maintaining the desired pressure equalization between chambers 7 and 9 to protect the integrity of vessel 8.

As the principal feature of the present invention, means 30 is mounted in reaction chamber 9 and provides a water boiling enclosure 28 having a vapor discharge opening 29 communicating with the interior of chamber 9 and being constructed to confine liquid water within the enclosure while permitting water vapor to escape through opening 29; and means 31 for introducing water under pressure into enclosure 28. Means 31 comprises a positive displacement high-pressure precision pump for providing precision water flow at the high pressure at which the apparatus operates, typically, about 25 atmospheres. Pump 31 has its inlet connected to a source of pure water, as illustrated in the drawing, and its discharge connected by conduit 32 to a four-way valve 33 which is, in turn, connected to conduit 13 so as to provide in one position of the valve, as illustrated, the flow of high-pressure water into enclosure 28. Chamber 9 is normally operated in the range of 600° C. to 1,000° C. and the water introduced into enclosure 28 will vaporize and pass out through opening 29 into chamber 9. As here shown, means 30 consists of a separate housing which may be positioned into chamber 9 through the access end thereof and may be formed as a tubular member having a continuous side wall 36, a closed end wall 37, here disposed interiorly of chamber 9, and an open end adjacent wall 23 providing opening 29. A dam 38 is mounted across the open end of the enclosure adjacent wall 23 for retaining liquid water in the enclosure for the period required for its vaporization.

Other connections shown made to the apparatus here include parallel conduits 41 and 42 connected to sources of oxygen gas and hydrogen chloride gas and through pressure regulators 43 and 44, sonic orifices 46 and 47, and valves 48 and 49 to conduit 14 for the optional introduction of oxygen gas and hydrogen chloride gas into the reaction chamber 9. For convenience, conduit 14 may terminate within enclosure 28. Conduits 51 and 52 are connected to sources of nitrogen gas and conduit 52 is connected through pressure regulator 53, sonic orifice 54 and valve 55 to four-way valve 33 so that nitrogen gas may alternatively be injected into the reaction chamber 9. A drain connection 56 is made to valve 33 so as to divert the water flow in the positioning of valve 33 to inject nitrogen gas into the apparatus. Conduit 51 is connected through pressure regulator 57 and three-way valve 58 to conduit 26 for pressurizing the outer chamber 7. Valve 58 is also connected to a vent conduit 59, as shown; and check valves 61 and 62 are connected as shown in the circuit to obtain the optional gaseous flows desired.

What is claimed is:

1. In a high-pressure, high-temperature gaseous chemical apparatus having a housing providing a pressure chamber and a vessel mounted therein and providing a reaction chamber dimensioned for receipt of semiconductor wafers and first means for heating said reaction chamber, for introducing therein chemically active gas under pressure, for introducing an inert gas under pressure in said pressure chamber external of said vessel for equalizing the pressures in said chambers, and for discharging said active gas from said reaction chamber in a continuous flow operation, the improvement comprising:

second means in said reaction chamber providing a water boiling enclosure having a water vapor discharge opening communicating with the interior of said reaction chamber and being constructed to confine liquid water therein while permitting water vapor escape through said opening; and third means for introducing water under pressure into said enclosure;

said second means being formed for discharging water vapor to said reaction chamber in a continuous flow operation.

2. The apparatus of claim 1, said first means introducing said chemically active gas into one end of said reaction chamber; and said enclosure having a closed end remote from said reaction chamber end and having said vapor discharge passage adjacent said reaction chamber end.

3. The apparatus of claim 2, said enclosure being formed with a dam adjacent said reaction chamber end for retaining liquid water in said enclosure.

\* \* \* \* \*